(12) United States Patent
Xu et al.

(10) Patent No.: US 8,630,113 B1
(45) Date of Patent: Jan. 14, 2014

(54) APPARATUS FOR MEMORY WITH IMPROVED PERFORMANCE AND ASSOCIATED METHODS

(75) Inventors: Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 241 days.

(21) Appl. No.: 12/277,411

(22) Filed: Nov. 25, 2008

(51) Int. Cl.
*G11C 11/34* (2006.01)

(52) U.S. Cl.
USPC ............ 365/180; 365/177; 365/175; 365/179

(58) Field of Classification Search
USPC .................................. 365/180, 177, 175, 179
See application file for complete search history.

(56) References Cited

U.S. PATENT DOCUMENTS

| 5,504,451 | A * | 4/1996 | Smayling et al. ............. 327/438 |
| 7,078,739 | B1 * | 7/2006 | Nemati et al. ................. 257/107 |
| 2007/0189067 | A1 * | 8/2007 | Goodwin ...................... 365/180 |
| 2007/0211535 | A1 * | 9/2007 | Kim ........................ 365/185.21 |
| 2007/0259490 | A1 * | 11/2007 | Voldman ....................... 438/218 |
| 2009/0086537 | A1 * | 4/2009 | Kitagawa ...................... 365/180 |

OTHER PUBLICATIONS

T. Sugizaki et al., 35-nm Gate-Length and Ultra Low-voltage (0.45 V) Operation Bulk Thyristor-SRAM/DRAM (BT-RAM) Cell with Triple Selective Epitaxy Layers (TELs), 2008 Symposium on VLSI Technology Digest of Technical Papers, pp. 198-199.
T. Sugizaki et al., Low voltage/Sub-ns Operation Bulk Thyristor-SRAM (BT-RAM) Cell with Double Selective Epitaxy Emitters (DEE), 2007 Symposium on VLSI Technology Digest of Technical Papers, pp. 170-171.
F. Nemati et al., A Novel Thyristor-based SRAM Cell (T-RAM) for High-Speed, Low-Voltage, Giga-scale Memories (IEEE 1999).
F. Nemati et al., Fully Planar 0.562 μm$^2$ T-RAM Cell in 130 nm SOI CMOS Logic Technology for High-Density High Performance SRAMs (IEEE 2004).

* cited by examiner

*Primary Examiner* — Vu Le
*Assistant Examiner* — Han Yang
(74) *Attorney, Agent, or Firm* — Law Offices of Maximilian R. Peterson

(57) ABSTRACT

An integrated circuit (IC) includes a memory circuit. The memory circuit includes a plurality of thyristors. The plurality of thyristors are coupled in tandem.

34 Claims, 14 Drawing Sheets

APPARATUS FOR MEMORY WITH IMPROVED PERFORMANCE AND ASSOCIATED METHODS

TECHNICAL FIELD

The disclosed concepts relate generally to memory and storage circuits and systems. More particularly, disclosed concepts concern latches with improved performance and associated methods.

BACKGROUND

Memory and storage devices proliferate in virtually all modern digital or mixed-signal electronic devices. Such devices may store general data and information, for example, user data, computer data, communication data, and the like. The increase in the capabilities and ubiquity of electronic devices has led to a corresponding increase in the capacity of storage devices. At the same time, many applications specify or demand relatively good performance from memory and storage circuits and devices.

SUMMARY

The disclosed concepts relate to latch, memory, or storage apparatus, and associated methods. One aspect of the disclosed concepts relates to memory circuit arrangements. In one exemplary embodiment, and IC includes a memory circuit. The memory circuit includes a plurality of thyristors that are coupled in tandem. In another exemplary embodiment, a circuit arrangement includes a memory cell, and an interface circuit coupled to the memory cell. The memory cell includes a thyristor. The interface circuit includes a transistor coupled to a row line and a column line.

Another aspect of the disclosed concepts relates to memory circuits in PLDs. In one exemplary embodiment, a PLD includes a configuration memory. The configuration memory includes a memory cell. The memory cell includes at least one thyristor.

Yet another aspect of the disclosed concepts relates to methods of configuring or programming PLDs. In one exemplary embodiment, a method of configuring programmable resources in a PLD to implement a desired design includes receiving specifications of the desired design, and generating configuration data for the PLD. The method further includes providing the configuration data to a configuration memory of the PLD. The configuration memory of the PLD includes at least one memory circuit that has at least one thyristor.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Generally, the disclosed concepts relate generally to memory and storage circuits and systems. More particularly, disclosed concepts concern latches, memories, and memory circuits and systems with improved performance and associated methods. One may use the disclosed apparatus and methods in a wide variety of applications, for example, integrated circuits (ICs) generally, application specifics ICs (ASICs), programmable logic devices (PLDs), etc.

The disclosed concepts provide many advantages. First, a memory or latch circuit according to the disclosed concepts exhibits no or little stability problems. Unlike conventional circuits, the circuitry according to disclosed concepts do not suffer from static noise margin, write margin, etc.

Figure 8:
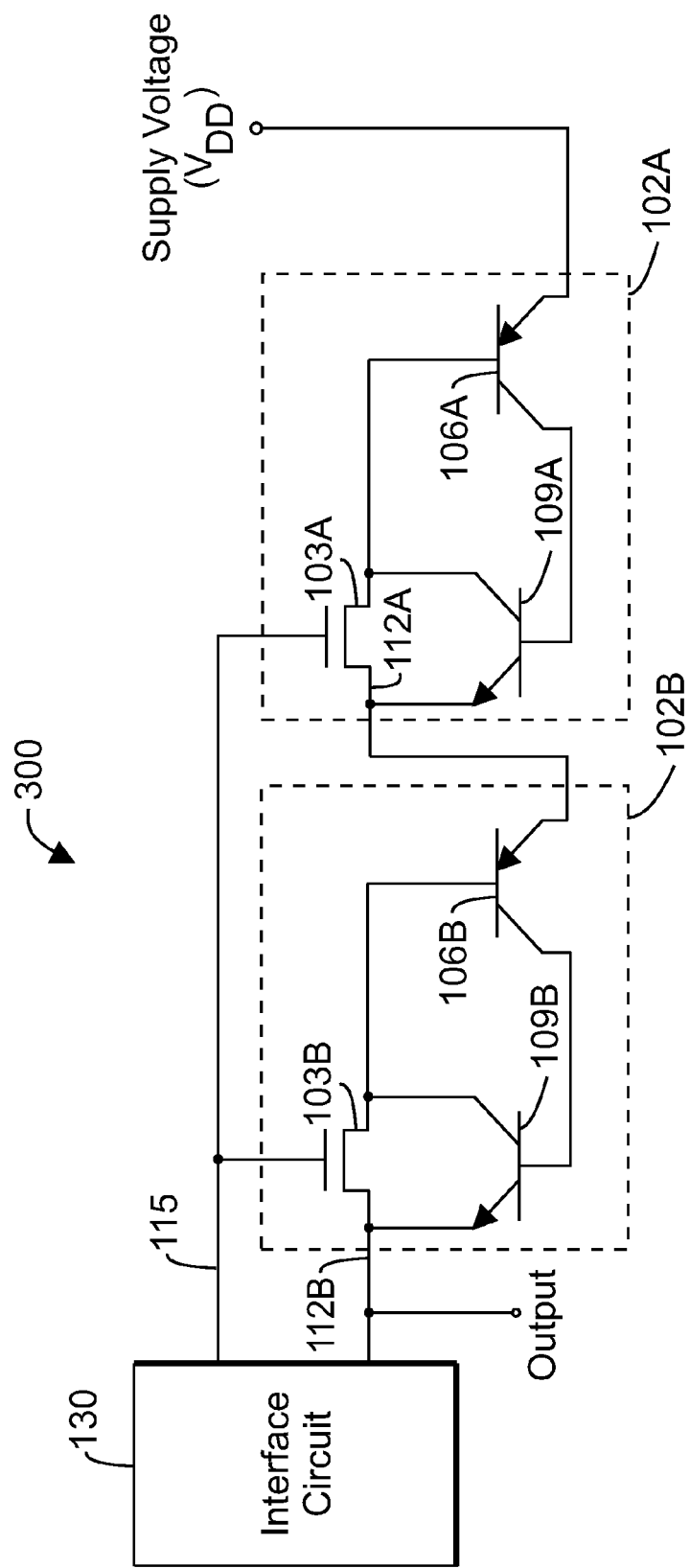
FIG. 8 illustrates a circuit arrangement according to an exemplary embodiment that uses at least two thyristors.
Figure 9:
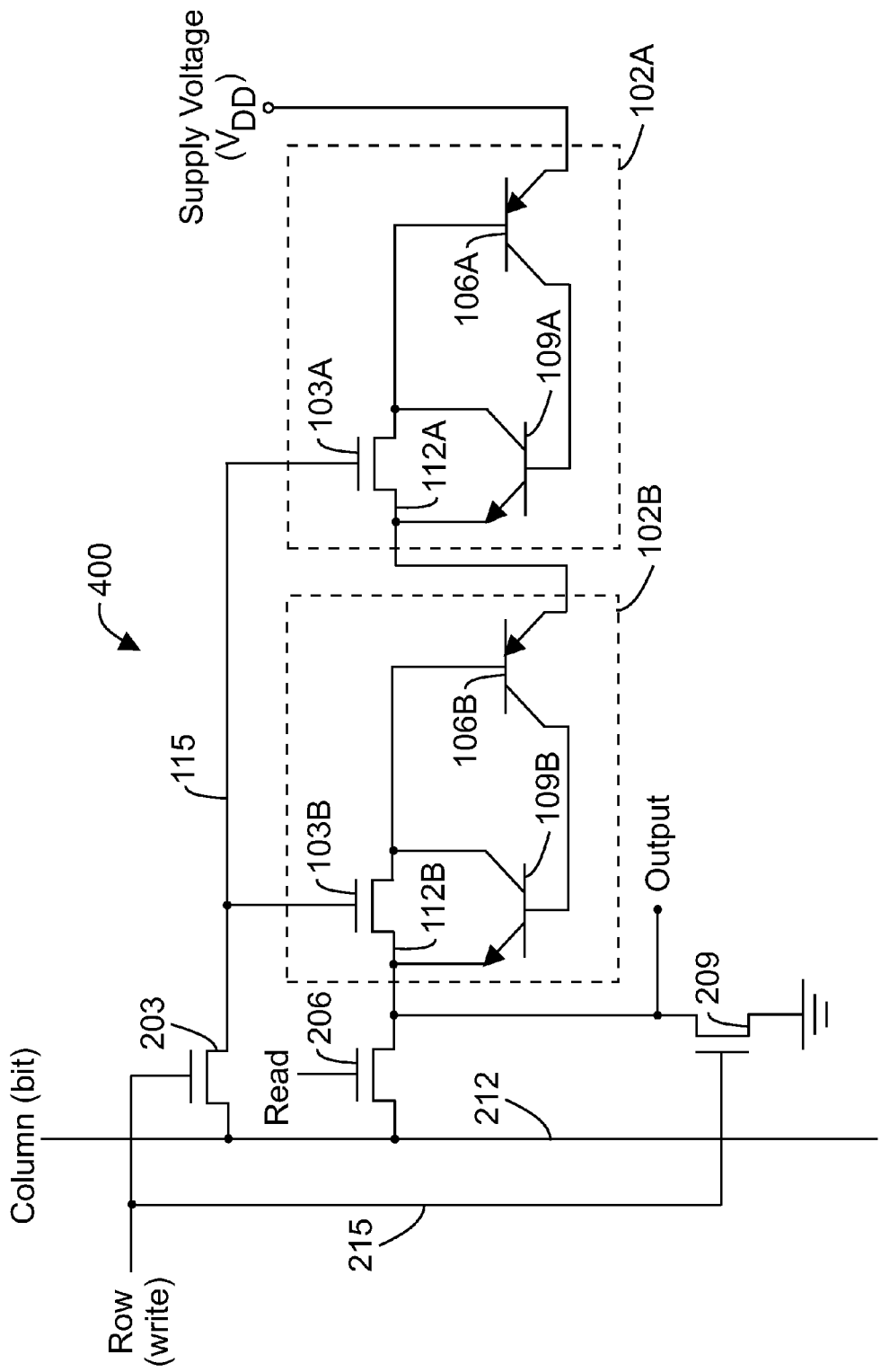
FIG. 9 illustrates a circuit arrangement according to another exemplary embodiment that uses at least two thyristors.

Second, the disclosed circuits reduce SEUs for memory cells or latches. SEUs generally occur because of alpha particles (e.g., lead used in packaging), cosmic rays, or both. The disclosed circuits use thyristors, which exhibit less sensitivity to SEUs because of their latching action. Furthermore, by using more than one thyristor (e.g., two thyristors, as shown in FIGS. 8 and 9, and described in detail below), reduces the probability of SEUs affecting circuitry according to the disclosed concepts. Thus, the disclosed circuits provide improved susceptibility to SEUs.

Third, the disclosed circuits are compatible with complementary metal oxide semiconductor (CMOS) fabrication processes. In other words, one may fabricate the thyristors in the disclosed circuits using CMOS fabrication processes. The disclosed circuits also use metal oxide semiconductor (MOS) transistors that one may fabricate using CMOS processes.

Fourth, the disclosed concepts provide good scalability with CMOS fabrication processes. Fifth, latches according to the disclosed concepts exhibit relatively little standby leakage and, hence, less static power consumption. The disclosed circuits have PN junction leakage currents, rather than channel leakage currents. The PN junction leakage currents have relatively small values compared to channel leakage currents.

Sixth, latch or memory cells according to the disclosed concepts occupy relatively little semiconductor or IC area and, hence, provide area and cost savings. For example, exemplary embodiments according to the disclosed concepts occupy half the chip area compared to a six-transistor (6T) static random access memory (SRAM) cell. More specifically, a memory cell that uses two thyristor circuits (see FIGS. 8-9 and their accompanying descriptions) occupies about 60 $F^2$, compared to about 120 $F^2$ for a 6T SRAM cell. Thus, a two-thyristor memory cell according to the disclosed concepts provides about 50% reduction in cell size.

Figure 1:
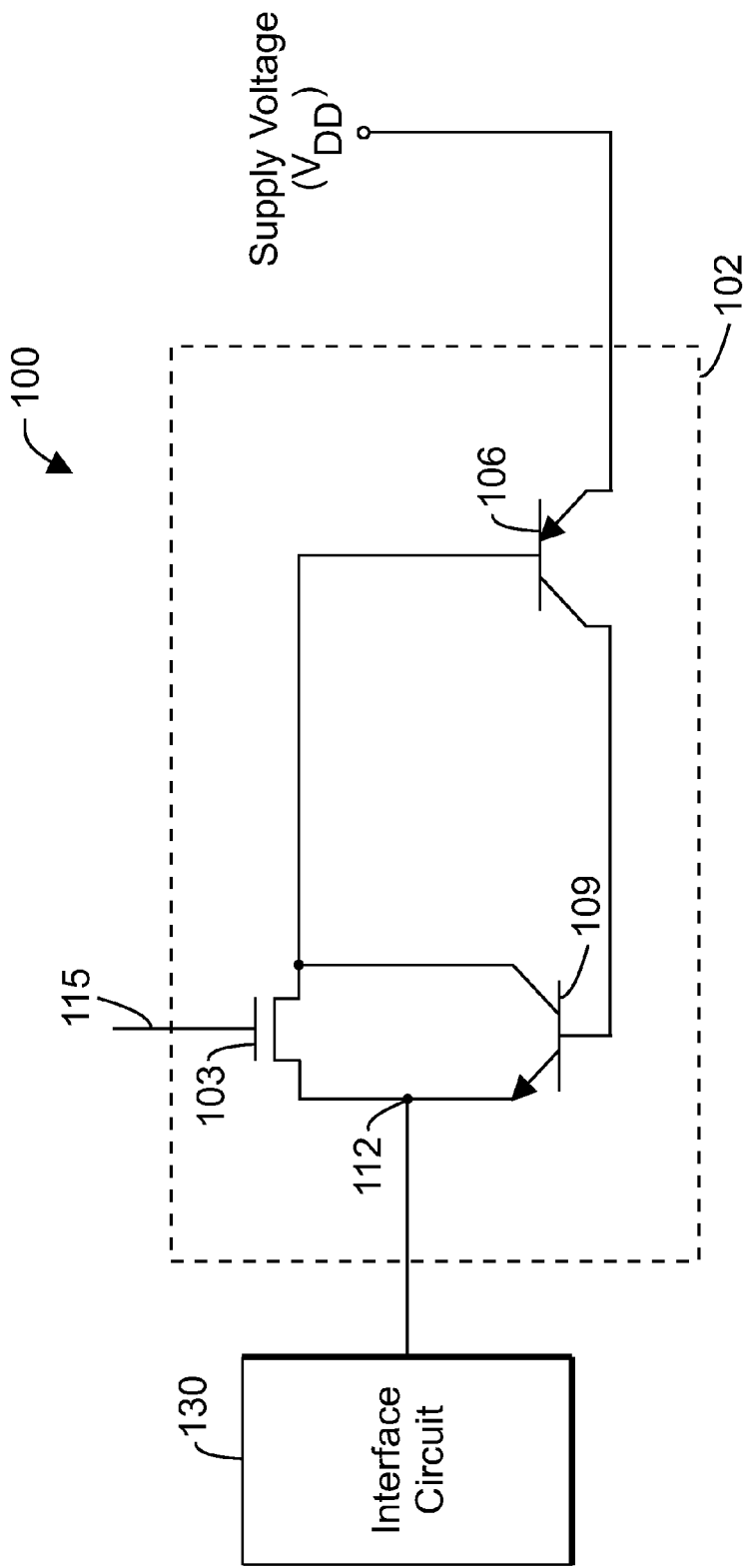
FIG. 1 illustrates a circuit arrangement according to an exemplary embodiment that uses a thyristor.

FIG. 1 illustrates a circuit arrangement 100 according to an exemplary embodiment. Generally speaking, FIG. 1 includes a memory cell (or latch or storage device or circuit) 102, and an interface circuit 130. Latch 102 includes transistors 103, 106, and 109. Transistor 103 is a metal oxide semiconductor (MOS) transistor. In the embodiment shown, transistor 103 is an N-type transistor. Persons of ordinary skill in the art who have the benefit of the description of the disclosed concepts, however, understand that one may use other types of transistors in other exemplary embodiments.

Transistor 106 constitutes a PNP bipolar junction transistor (BJT). Transistor 109, on the other hand, constitutes an NPN BJT. Transistors 106 and 109 are coupled to one another in a back-to-back manner. In other words, the collector of transistor 109 couples to the base of transistor 106, and vice-versa. Thus, transistor 106 and 109 couple to each other to form a thyristor.

In response to signal 115, transistor 115 facilitates the operation of latch 102, as described in detail below. Interface circuit 130 facilitates the operation of latch 102, as described in detail below in connection with FIG. 2. Interface circuit 130 provides a signal to node 112 of latch 102, i.e., the emitter of transistor 109. A supply source (e.g., supply voltage labeled as "$V_{DD}$" in FIG. 1) supplies power to the circuitry in FIG. 1, specifically, the emitter of transistor 106.

Figure 2:
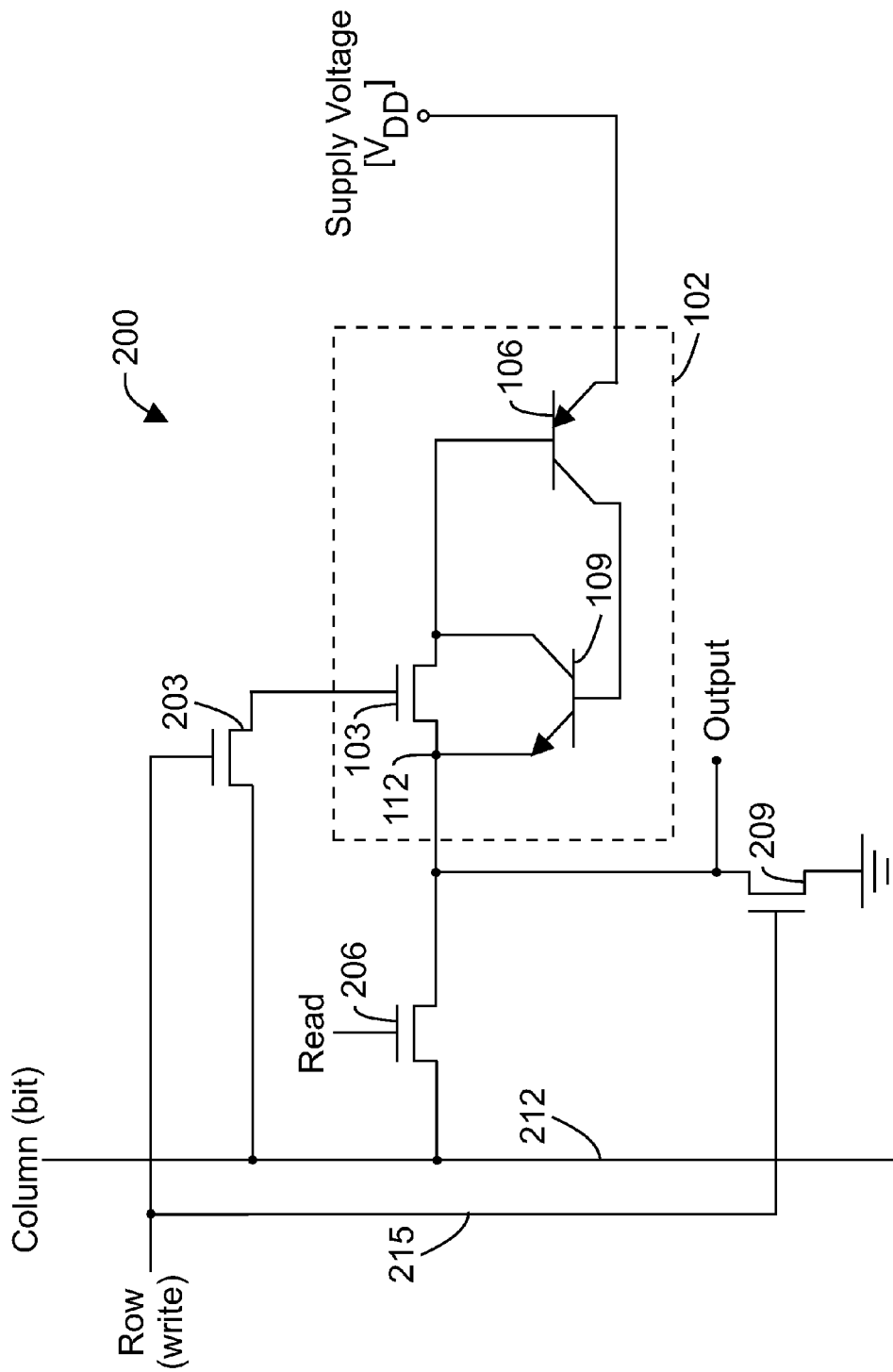
FIG. 2 depicts a circuit arrangement according to another exemplary embodiment that uses a thyristor.

FIG. 2 depicts a circuit arrangement 200 according to another exemplary embodiment. Circuit arrangement 200 includes memory cell (or latch or storage device or circuit) 102. In addition, circuit arrangement 200 includes an interface circuit that facilitates operation of latch 102, and of circuit arrangement 200 generally.

Specifically, the interface circuit includes transistor 203, transistor 206, and transistor 209. A row (write) signal 215, a column (bit) signal 212, and a read signal control the operation of latch 102.

The read and write operations work as follows. To write a binary "1" value (e.g., a logic high level in a positive logic system) to latch 102, one applies a logic high signal to the column (bit) line. One then applies a logic high signal to the row (write) line, i.e., to the gates of transistors 203 and 209. During this operation, the read line has a logic low (binary "0") value, and the supply voltage has its nominal voltage ($V_{DD}$).

As a result of applying a "1" signal to the row (write) line, transistors 203 and 209 turn on. Transistor 203 couples the gate of transistor 103 to the column (bit) line, which has a value of binary "1." Thus, transistor 103 turns on, and couples the base of transistor 106 to ground through transistor 209 (which had turned on through the application of the "1" signal to the row (write) line).

Figure 4:
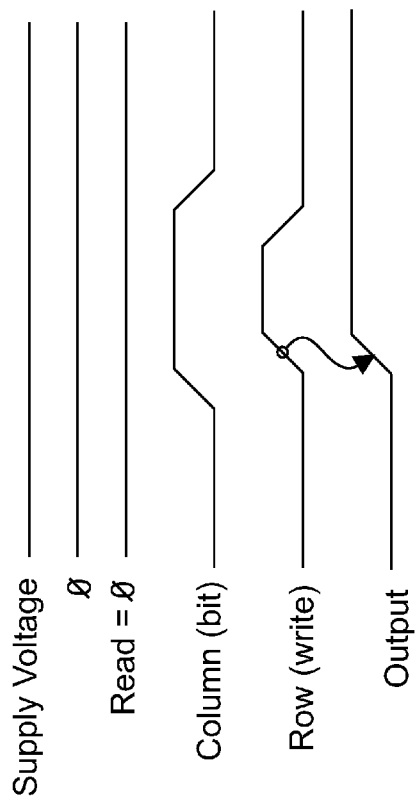
FIG. 4 illustrates various signals as a function of time during a write operation of a latch according to an exemplary embodiment.

The coupling of the base of transistor 106 to ground causes it to conduct current to the base of transistor 109. As a result, transistor 109 turns on, and the voltage at storage node 112 (the output node) goes to a logic high value. In other words, latch 102 now stores a logic high or binary "1" value. FIG. 4 shows the various signals during the write (binary "1") operation.

The thyristor in latch 102 has a holding current, as persons of ordinary skill in the art who have the benefit of the description of the disclosed concepts understand. Thus, after the de-assertion of the row (write) and column (bit) signals, the thyristor should conduct some current, at or above its holding current, in order for it to retain the stored value.

Figure 3:
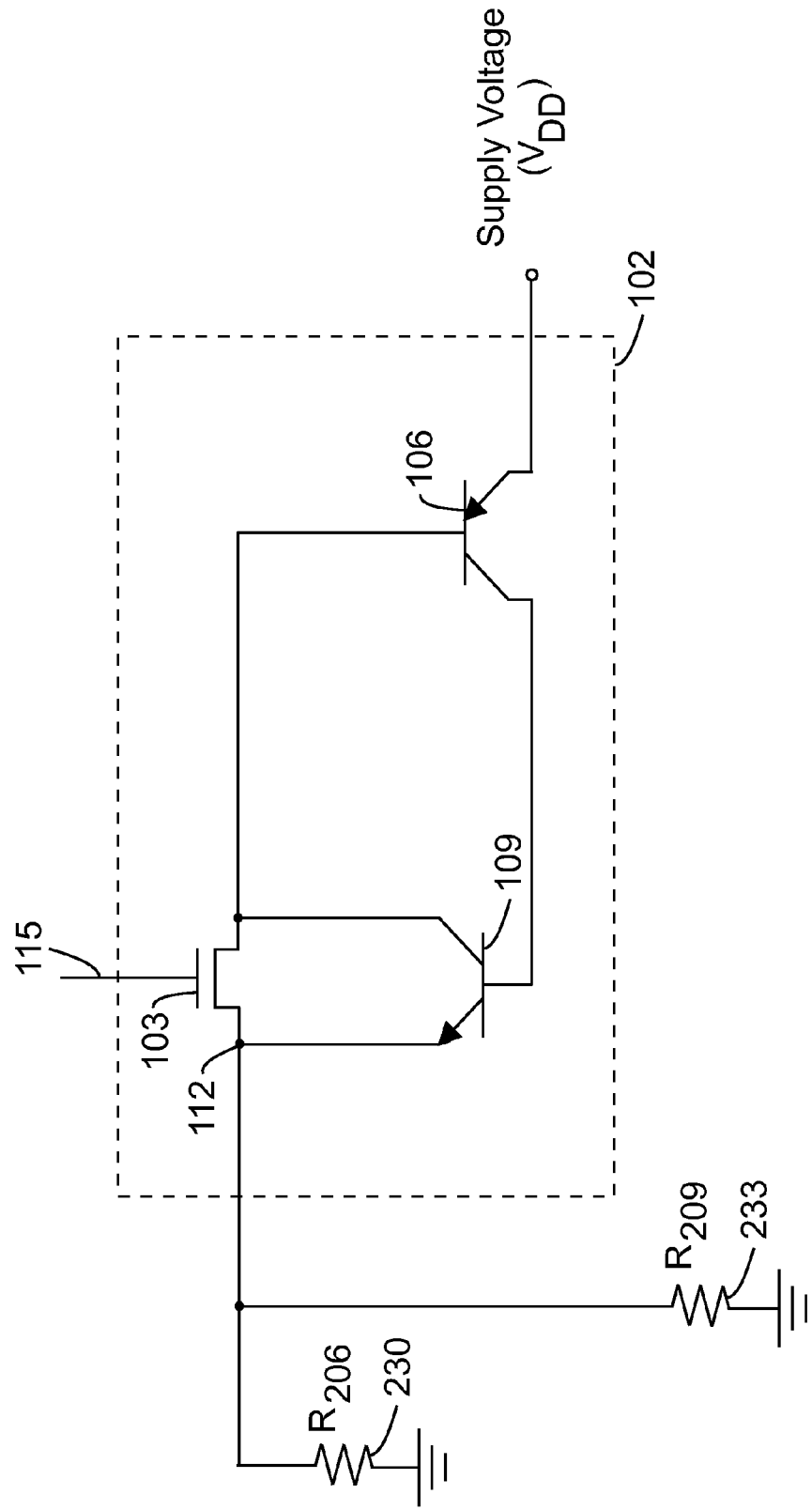
FIG. 3 shows a circuit arrangement that includes equivalent resistances that provide a thyristor hold current in exemplary embodiments.

The leakage current of transistors 206 and 209 provides the hold current for the thyristor in latch 102. FIG. 3 shows a circuit arrangement that includes equivalent resistances for transistors 206 and 209. Specifically, resistor 230 constitutes the equivalent resistance of transistor 206 (see FIG. 2) in the off state. Similarly, resistor 233 constitutes the equivalent resistance of transistor 209 (see FIG. 2) in the off state.

The current flowing from the supply source ($V_{DD}$) through the thyristor (the back-to-back coupled combination of transistors 106 and 109) and through resistors 230 and 233 constitutes the thyristor hold current. The hold current allows the thyristor and, hence, latch 102, to retain a binary "1" value.

To write a binary "0" value (e.g., a logic low level in a positive logic system), one lowers the current flowing through the thyristor to a level below the hold current. Doing so causes the thyristor to turn off, and for latch 102 to store a binary "0" value.

More specifically, similar to writing a binary "1" value, one asserts the column (bit) and row (write) signals (the read signal has a logic low or binary "0" value). One then lowers the supply voltage to the ground potential, or to a sufficiently small voltage, to reduce the current flowing through the thyristor to below the thyristor hold current.

Figure 5:
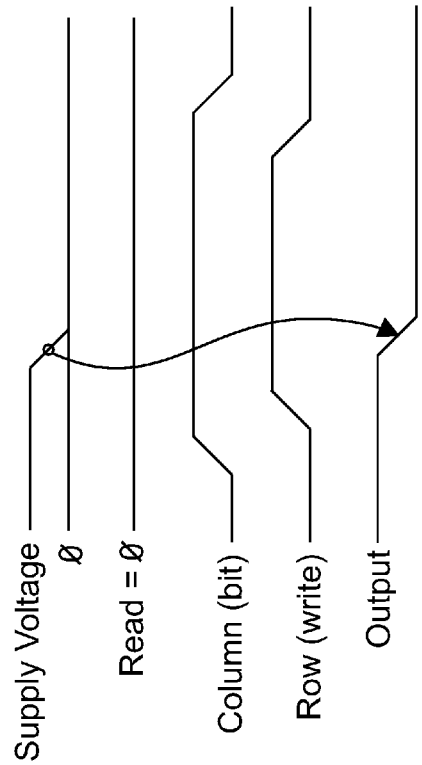
FIG. 5 depicts various signals as a function of time during another write operation of a latch according to an exemplary embodiment.

Once the thyristor current falls below the hold current, the thyristor turns off. Consequently, the output voltage at node 112 falls to ground potential (or to a voltage close to the ground potential) because of the leakage path through transistors 206 and 209 and minority and majority carrier recombination. As a result, latch 102 stores a binary "0" value. FIG. 5 shows the various signals during the write (binary "0") operation.

Figure 6:
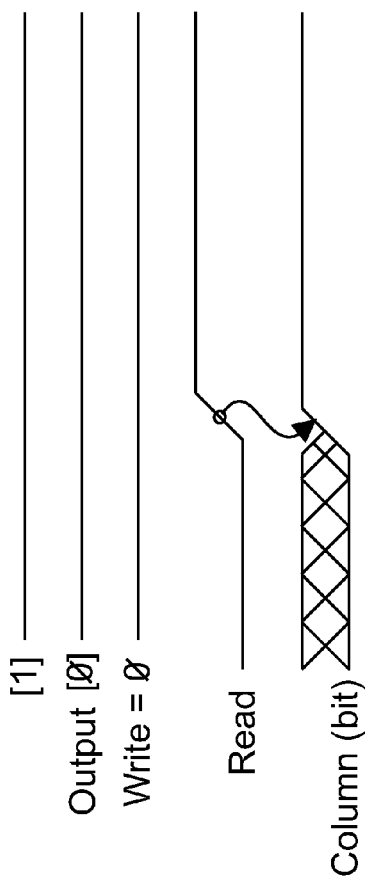
FIG. 6 illustrates various signals as a function of time during a read operation of a latch according to an exemplary embodiment.
Figure 7:
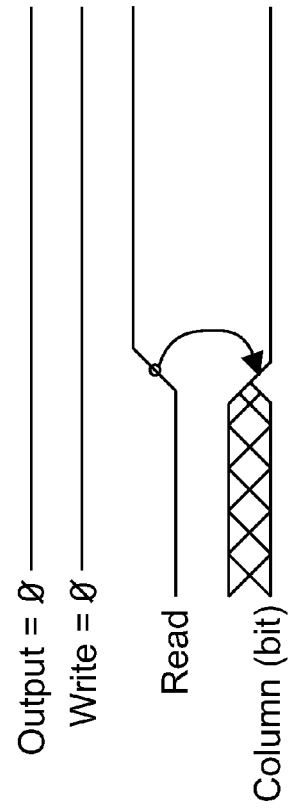
FIG. 7 shows various signals as a function of time during another read operation of a latch according to an exemplary embodiment.

To read a stored value from latch 102, one de-asserts the row (write) signal. As a result, transistor 203 turns off. One then asserts the read line, which causes transistor 206 to turn on and couple node 112 (output node) to the column (bit) line. As a result, the stored value appears on the column (bit) line. FIG. 6 shows the various signals for reading a binary "1" value. Conversely, FIG. 7 illustrates the various signals for reading a binary "0" value.

In other embodiments, one may use more than one thyristor to implement storage circuits, latches, or memory cells or circuits. For example, in one exemplary embodiment, one may use two thyristors. As another example, in another exemplary embodiment, one may use more than two thyristors.

FIG. 8 illustrates a circuit arrangement 300 according to an exemplary embodiment that includes two thyristors. More particularly, circuit arrangement 300 includes memory cells (or latches or storage devices or circuits) 102A and 102B, and interface circuit 130. Latch 102A includes transistors 103A, 106A, and 109A. Similarly, latch 102B includes transistors 103B, 106B, and 109B. Each of latches 102A and 102B therefore has the same structure as latch 102 (see FIG. 2), and operates similarly.

As FIG. 8 illustrates, latch 102A couples to latch 102B in a tandem or series or cascade fashion. Supply voltage ($V_{DD}$) couples to the emitter of transistor 106A. The emitter of transistor 109A (node 112A) couples to the emitter of transistor 106B. The emitter of transistor 109B (node 112B) couples to interface circuit 130. Node 115 of interface circuit 130 drives the gates of transistors 103A and 103B of latches 102A and 102B, respectively.

FIG. 9 depicts a circuit arrangement 400 according to another exemplary embodiment. Circuit arrangement 400 includes memory cells (or latches or storage devices or circuits) 102A-102B. Similar to latches 102A-102B in FIG. 8, each of latches 102A and 102B in circuit arrangement 400 has the same structure as latch 102 (see FIG. 2), and operates in a like manner.

Each of latches 102A-102B includes a thyristor, as described in detail above. Thus, the embodiment shown in FIG. 9 includes two latches, each with a thyristor. As persons of ordinary skill in the art who have the benefit of the description of the disclosed concepts understand, rather than using two latches 102A-102B, one may use more than two latches, i.e., more than two thyristors, as desired.

Referring to FIG. 9, in addition to latches 102A-102B, circuit arrangement 400 includes an interface circuit that facilitates operation of latches 102A-102B, and of circuit arrangement 400 generally. Specifically, the interface circuit includes transistor 203, transistor 206, and transistor 209. A row (write) signal 215, a column (bit) signal 212, and a read signal control the operation of latches 102A-102B. Generally, the interface circuit has the same structure as the interface circuit in FIG. 2, and operates similarly.

Similar to FIG. 8, latch 102A in FIG. 9 couples to latch 102B in a tandem or series or cascade fashion. Supply voltage ($V_{DD}$) couples to the emitter of transistor 106A. The emitter of transistor 109A (node 112A) couples to the emitter of transistor 106B. The emitter of transistor 109B (node 112B) couples to interface circuit 130. Node 115 of interface circuit 130 drives the gates of transistors 103A and 103B of latches 102A and 102B, respectively.

The read and write operations work as follows. To write a binary "1" value (e.g., a logic high level in a positive logic system) to latches 102A-102B, one applies a logic high signal to the column (bit) line. One then applies a logic high signal to the row (write) line, i.e., to the gates of transistors 203 and 209. During this operation, the read line has a logic low (binary "0") value, and the supply voltage has its nominal voltage ($V_{DD}$).

As a result of applying a "1" signal to the row (write) line, transistors 203 and 209 turn on. Transistor 203 couples the gate of transistors 103A and 103B to the column (bit) line, which has a value of binary "1." Thus, transistors 103A and 103B turns on, and couple, respectively, the base of transistors 106A and 106B to ground through transistor 209 (which had turned on through the application of the "1" signal to the row (write) line).

The coupling of the base of transistors 106A and 106B to ground causes those transistors to conduct current to the base of transistors 109A and 109B, respectively. As a result, transistors 109A and 109B turn on, and the voltages at storage nodes 112A and 112B (the output nodes) go to a logic high value. Put another way, each of latches 102A and 102B now stores a logic high or binary "1" value.

Figure 10:
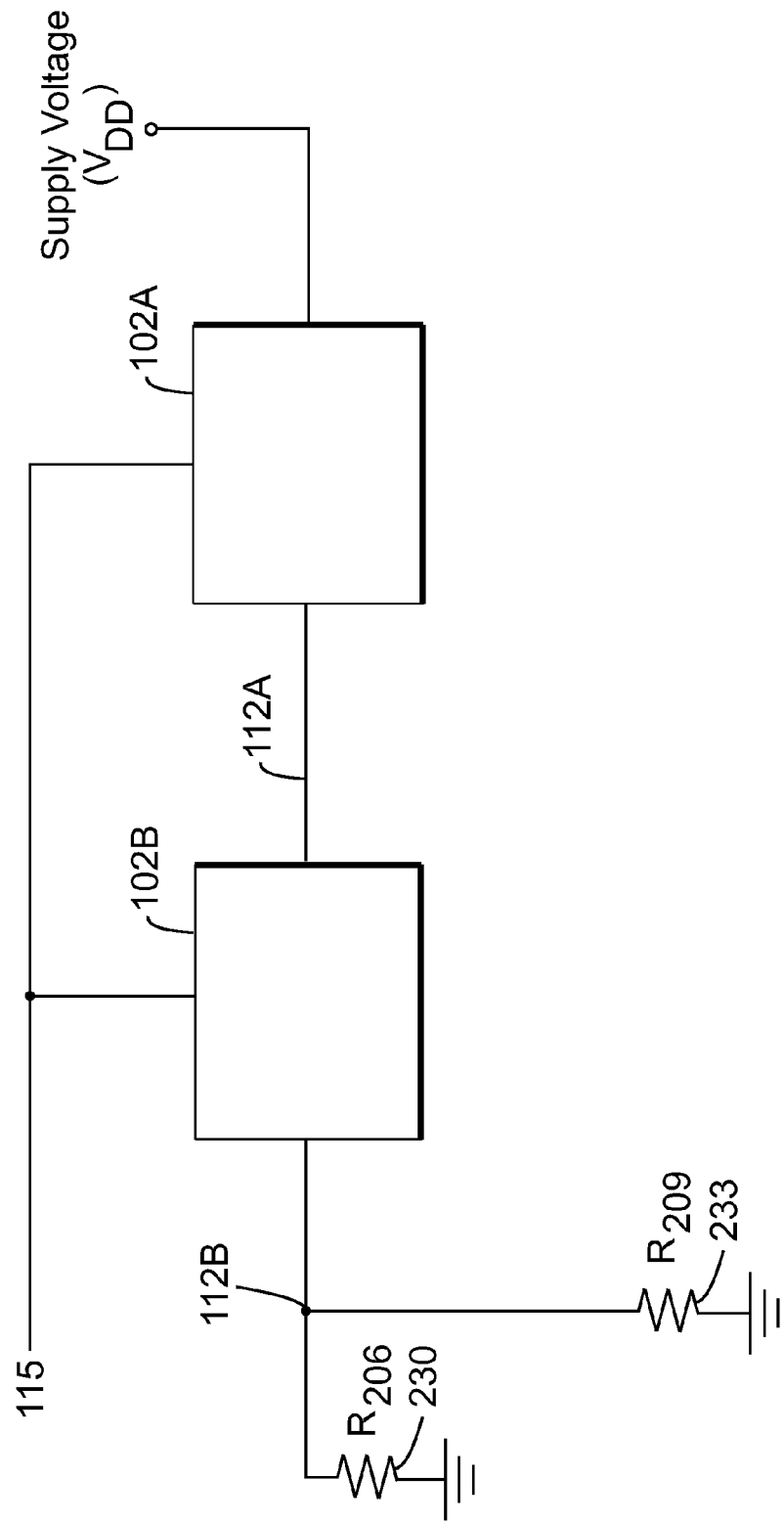
FIG. 10 shows a circuit arrangement that includes equivalent resistances that provide a thyristor hold currents in exemplary embodiments.

As noted above, each of the thyristors in latches 102A-102B has a holding. The leakage current of transistors 206 and 209 provides the hold current for the thyristors in latches 102A-102B. FIG. 10 shows a circuit arrangement that includes equivalent resistances for transistors 206 and 209. Specifically, resistor 230 constitutes the equivalent resistance of transistor 206 (see FIG. 9) in the off state. Similarly, resistor 233 constitutes the equivalent resistance of transistor 209 (see FIG. 9) in the off state.

The current flowing from the supply source ($V_{DD}$) through the thyristors (the back-to-back coupled combination of transistors 106A and 109A, and the back-to-back coupled combination of transistors 106B and 109B) and through resistors 230 and 233 constitutes the thyristor hold current. The hold current allows the thyristors and, hence, latches 102A and 102B, to retain a binary "1" value.

Conversely, to write a binary "0" value (e.g., a logic low level in a positive logic system), one lowers the current flowing through the thyristors to a level below their hold currents. Doing so causes the thyristors to turn off, and for latches 102A and 102B to store a binary "0" value.

More particularly, similar to writing a binary "1" value, one asserts the column (bit) and row (write) signals (the read signal has a logic low or binary "0" value). One then lowers the supply voltage to the ground potential, or to a sufficiently small voltage, to reduce the current flowing through the thyristors to below the thyristor hold current.

When the current flowing through the thyristors falls below their hold current, the thyristors turn off. Consequently, the output voltage at nodes 112A and 112B falls to ground potential (or to a voltage close to the ground potential) because of the leakage path through transistors 206 and 209 and minority and majority carrier recombination. As a result, latches 102A and 102B store a binary "0" value.

To read a stored value from latches 102A and 102B, one de-asserts the row (write) signal. As a result, transistor 203 turns off. One then asserts the read line, which causes transistor 206 to turn on and couple node 112B (output node of latch 102B) to the column (bit) line. As a result, the stored value appears on the column (bit) line.

As noted, one may use memory cells (or latches or storage devices or circuits) according to the disclosed concepts in a variety of electronic circuitry, such as various types of ICs. As one example, one may use circuitry according to the disclosed concepts in PLDs.

Figure 11:
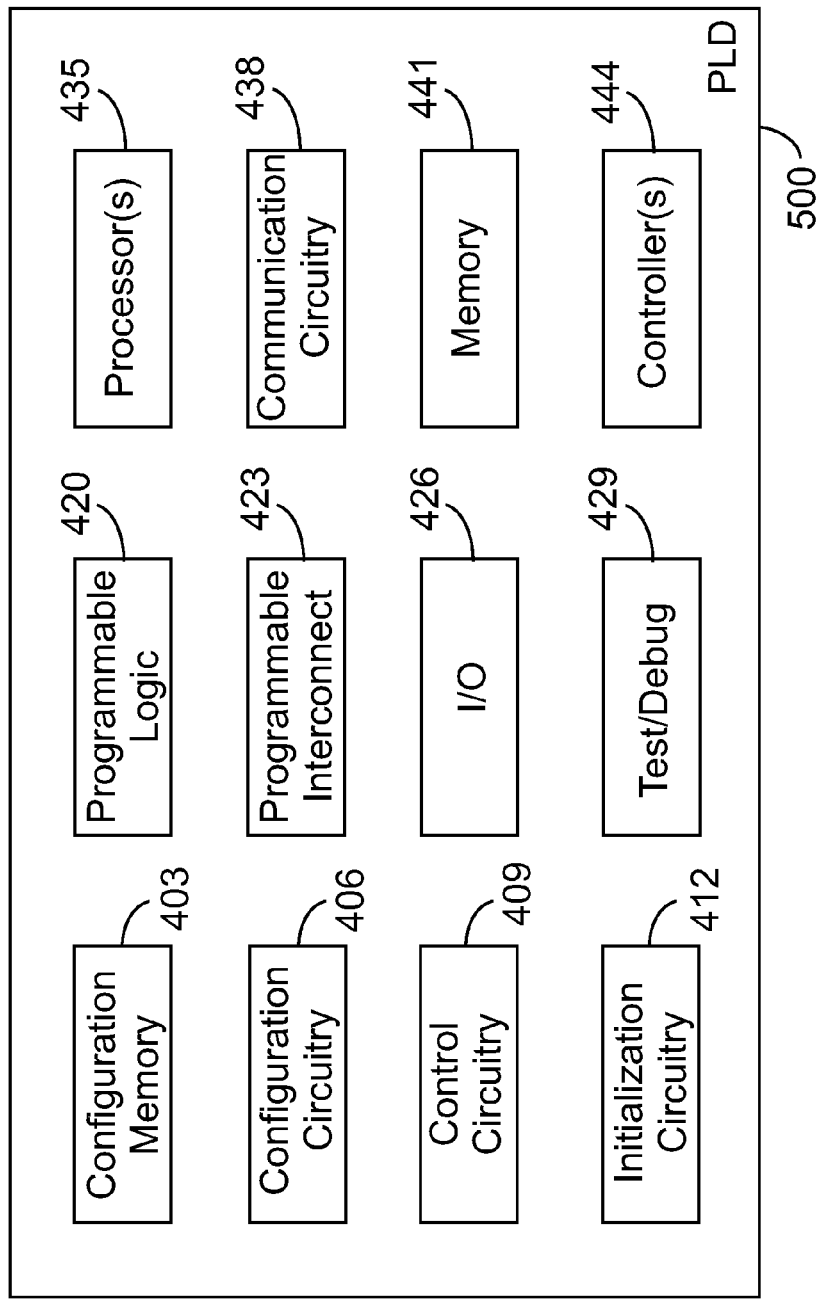
FIG. 11 illustrates a general block diagram of a PLD that includes circuitry according to illustrative embodiments.

FIG. 11 illustrates a general block diagram of a PLD 500 that includes circuitry according to illustrative embodiments. PLD 500 includes configuration circuitry 406, configuration memory (CRAM) 403, control circuitry 409, programmable logic 420, programmable interconnect 423, and I/O circuitry 426. In addition, PLD 500 may include test/debug circuitry 429, one or more processors 435, one or more communication circuitry 438, one or more memories 441, one or more controllers 444, and initialization circuit 412, as desired.

Note that the figure shows a simplified block diagram of PLD 500. Thus, PLD 500 may include other blocks and circuitry, as persons of ordinary skill in the art understand. Examples of such circuitry include clock generation and distribution circuits, redundancy circuits, and the like. Furthermore, PLD 500 may include, analog circuitry, other digital circuitry, and/or mixed-signal circuitry, as desired.

Programmable logic 420 includes blocks of configurable or programmable logic circuitry, such as look-up tables (LUTs), product-term logic, multiplexers (MUXs), logic gates, registers, memory, and the like. Programmable interconnect 423 couples to programmable logic 420 and provides configurable interconnects (coupling mechanisms) between various blocks within programmable logic 420 and other circuitry within or outside PLD 500.

Control circuitry 409 controls various operations within PLD 500. Under the supervision of control circuitry 409, PLD configuration circuitry 406 uses configuration data (which it obtains from an external source, such as a storage device, a host, etc.) to program or configure the functionality of PLD 500. Configuration data are typically stored in CRAM 403. The contents of CRAM 403 determine the functionality of various blocks of PLD 500, such as programmable logic 420 and programmable interconnect 423. Initialization circuit 412 may cause the performance of various functions at reset or power-up of PLD 500.

I/O circuitry 426 may constitute a wide variety of I/O devices or circuits, as persons of ordinary skill in the art who have the benefit of the disclosure understand. I/O circuitry 426 may couple to various parts of PLD 500, for example, programmable logic 420 and programmable interconnect 423. I/O circuitry 426 provides a mechanism and circuitry for various blocks within PLD 500 to communicate with external circuitry or devices.

Test/debug circuitry 429 facilitates the testing and troubleshooting of various blocks and circuits within PLD 500. Test/debug circuitry 429 may include a variety of blocks or circuits known to persons of ordinary skill in the art who have the benefit of the disclosure. For example, test/debug circuitry 429 may include circuits for performing tests after PLD 500 powers up or resets, as desired. Test/debug circuitry 429 may also include coding and parity circuits, as desired.

PLD 500 may include one or more processors 435. Processor 435 may couple to other blocks and circuits within PLD 500. Processor 435 may receive data and information from circuits within or external to PLD 500 and process the information in a wide variety of ways, as persons skilled in the art with the benefit of the disclosure in this document appreciate. One or more of processor(s) 435 may constitute a digital signal processor (DSP). DSPs allow performing a wide variety of signal processing tasks, such as compression, decompression, audio processing, video processing, filtering, and the like, as desired.

PLD 500 may also include one or more communication circuits 438. Communication circuit(s) 438 may facilitate data and information exchange between various circuits within PLD 500 and circuits external to PLD 500, as persons of ordinary skill in the art who have the benefit of the disclosure in this document understand.

PLD 500 may further include one or more memories 441 and one or more controller(s) 444. Memory 441 allows the storage of various data and information (such as user-data, intermediate results, calculation results, etc.) within PLD 500. Memory 441 may have a granular or block form, as desired. Controller 444 allows interfacing to, and controlling the operation and various functions of circuitry outside the PLD. For example, controller 444 may constitute a memory controller that interfaces to and controls an external synchronous dynamic random access memory (SDRAM), as desired.

Generally speaking, one may use memory cells (or latches or storage devices or circuits) according to the disclosed concepts in any of the circuitry in PLD 500, as desired. As mere examples, one may use such circuits in configuration memory 403, programmable logic 420, programmable interconnect 423, processor(s) 435, and memory 441. The foregoing blocks and circuits constitute merely illustrative examples. As persons of ordinary skill in the art who have the benefit of the description of the disclosed concepts understand, one may apply the disclosed concepts to other circuitry and blocks in PLD 500.

Figure 12:
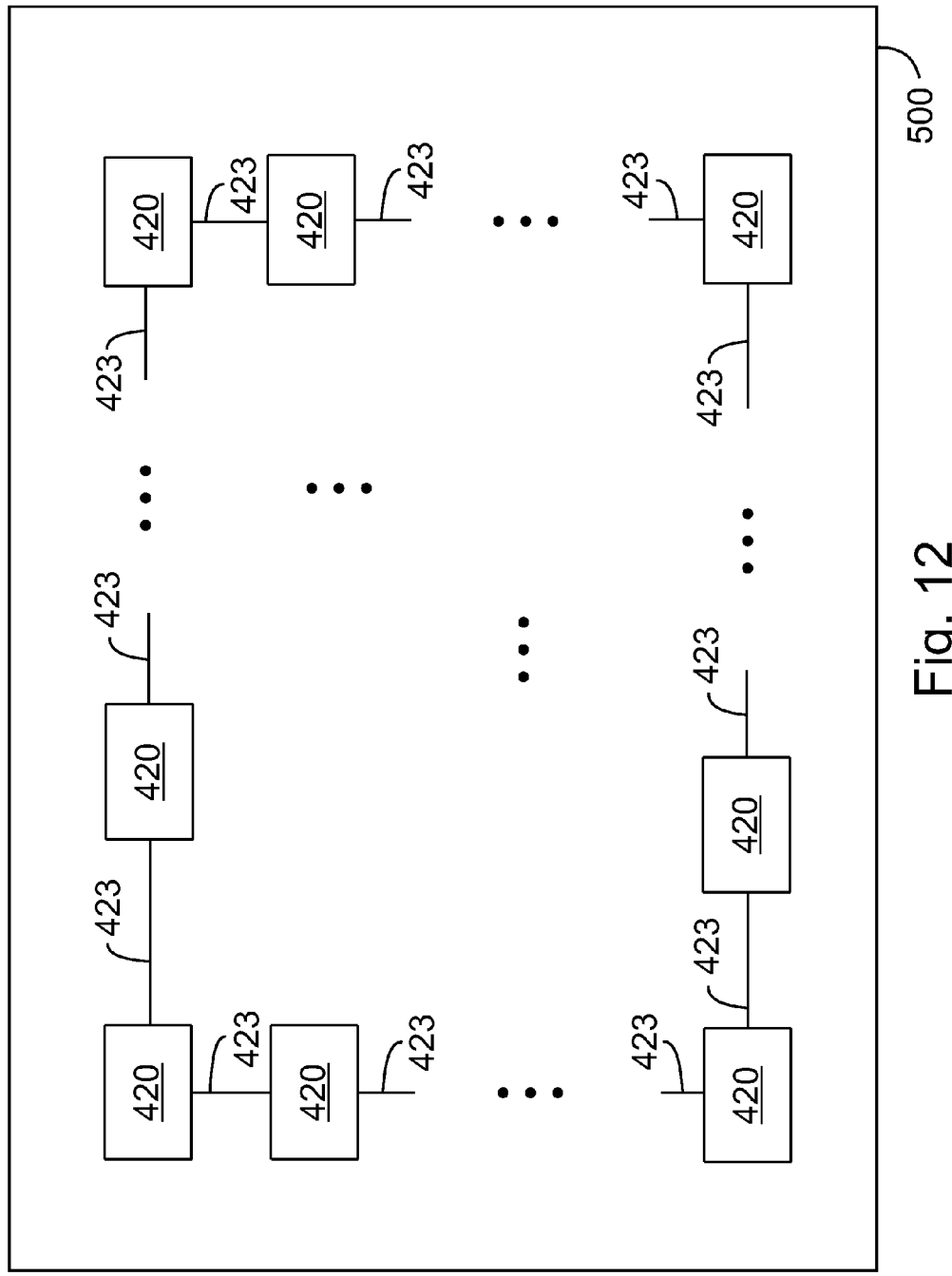
FIG. 12 shows a floor-plan of a PLD that may include circuitry according to illustrative embodiments.

As noted, PLD 500 includes a number of blocks of programmable resources. Implementing a user's design often entails using the programmable resources within PLD 500's floorplan. FIG. 12 shows a floor-plan of a PLD that may include circuitry according to the disclosed concepts. A block, part of a block, or a set of blocks may constitute a tile or region of PLD 500.

PLD 500 includes programmable logic 420 arranged as a two-dimensional array. Programmable interconnect 423, arranged as horizontal interconnect and vertical interconnect, couples the blocks of programmable logic 420 to one another. One may place the blocks in a particular manner so as to implement a user's design, as persons of ordinary skill in the art who have the benefit of the disclosure in this document understand.

In illustrative embodiments, PLD 500 has a hierarchical architecture. In other words, each block of programmable logic 420 may in turn include smaller or more granular programmable logic blocks or circuits. For example, in one embodiment, programmable logic 420 may constitute blocks of configurable logic named logic array block (LAB), and each LAB may include logic elements (LEs) or other circuitry (for example, configurable logic blocks (CLBs), as desired.

Persons of ordinary skill in the art who have the benefit of this disclosure understand, however, that a wide variety of other arrangements, with varying terminology and topology, are possible, and fall within the scope of the disclosed concepts. Furthermore, although FIG. 12 shows blocks of programmable logic 420, one may use PLDs with other or additional blocks (e.g., memory, processors, other blocks in FIG. 11, etc.) in their floorplans and take advantage of the disclosed concepts, as persons of ordinary skill in the art who have the benefit of this disclosure understand.

Regardless of the particular circuit arrangement in the PLD, as noted above, one may use one may use memory cells (or latches or storage devices or circuits) according to the disclosed concepts in programmable logic 420 and programmable interconnect 423, shown in FIG. 12. For example, one may implement LUTs, product term logic, and the like, using memory cells (or latches or storage devices or circuits) according to the disclosed concepts. As another example, one may implement latches or flip flops using the memory cells (or latches or storage devices or circuits) according to the disclosed concepts.

Furthermore, one may use memory cells (or latches or storage devices or circuits) according to the disclosed concepts in CRAM 403 (see FIG. 11). Such circuitry would operate in conjunction with PLD computer aided design (CAD) software to facilitate programming or configuring the PLD to implement a desired or specified function, for example, implement a user's circuit or design.

Figure 13:
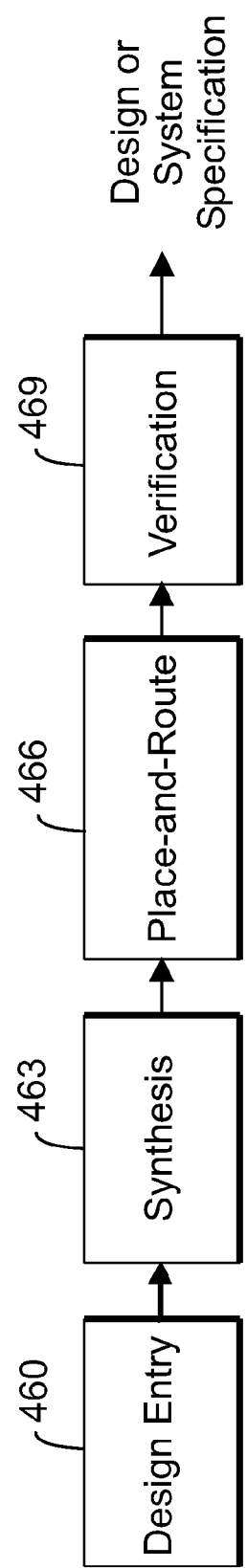
FIG. 13 depicts various software modules that PLD CAD software may use to program or configure PLDs that use circuitry according to the disclosed concepts.

FIG. 13 illustrates various software modules that PLD CAD software for programming or configuring PLDs according to the disclosed concepts. The modules include design-entry module 460, synthesis module 463, place-and-route module 466, and verification module 469. The following description provides an explanation of the operation of each module.

The CAD techniques may have a variety of applications, as persons of ordinary skill in the art who have the benefit of this disclosure understand. Examples include design area, timing performance, power requirements, and routability, as desired.

Design-entry module 460 allows the editing of various design description files using graphical or textual descriptions of a circuit or its behavior, such as schematics, hardware description languages (HDL), or waveforms, as desired. The user may generate the design files by using design-entry module 460 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 463 accepts the output of design-entry module 460. Based on the user-provided design, synthesis module 463 generates appropriate logic circuitry that realizes the user-provided design. One or more PLDs (not shown explicitly), such as PLD 500 in FIG. 11, implement the synthesized overall design or system.

Synthesis module 463 may also generate any glue logic that allows integration and proper operation and interfacing of various modules in the user's designs. For example, synthesis module 463 provides appropriate hardware so that an output of one block properly interfaces with an input of another block. Synthesis module 463 may provide appropriate hardware so as to meet the specifications of each of the modules in the overall design or system.

Furthermore, synthesis module 463 may include algorithms and routines for optimizing the synthesized design. Through optimization, synthesis module 463 seeks to more efficiently use the resources of the one or more PLDs that implement the overall design or system. Synthesis module 463 provides its output to place-and-route module 466. Following synthesis, one may include a technology mapping module (not shown explicitly).

Place-and-route module 466 uses the designer's timing specifications to perform optimal logic mapping and placement. The logic mapping and placement determine the use of logic resources within the PLD(s). By the use of particular programmable interconnects with the PLD(s) for certain parts of the design, place-and-route module 466 helps optimize the performance of the overall design or system. By the proper use of PLD routing resources, place-and-route module 466 helps to meet the critical timing paths of the overall design or system.

Place-and-route module 466 optimizes the critical timing paths to help provide timing closure faster in a manner known to persons of ordinary skill in the art with the benefit of this disclosure. As a result, the overall design or system can achieve faster performance (i.e., operate at a higher clock rate or have higher throughput).

Verification module 469 performs simulation and verification of the design. The simulation and verification seek in part to verify that the design complies with the user's prescribed specifications. The simulation and verification also aim at detecting and correcting any design problems before prototyping the design. Thus, verification module 469 helps the user to reduce the overall cost and time-to-market of the overall design or system.

Verification module 469 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and the like, as persons of ordinary skill in the art who have the benefit of the description of this disclosure understand.

Note that one may perform other or additional verification techniques as desired and as persons of ordinary skill in the art who have the benefit of this disclosure understand. Verification of the design may also be performed at other phases in the flow, as appropriate, and as desired.

Verification module 469 provides the design or system specification used to program or configure the PLD. Specifically, at a desired point (e.g., at power-up or reset), one uses the programming or configuration information provided by verification module 469 to program or configure the PLD (e.g., PLD 500 in FIGS. 11 and 12) to implement a desired or specified function, for example, implement a user's circuit or design.

More specifically, one may use a link between the computer running the CAD software (or some other source that stores the configuration data provided by the CAD software) to the PLD. The link (e.g., parallel or serial link) allows communicating the configuration or programming information and data to the PLD. The PLD stores appropriate configuration or programming data in CRAM 403. Using the data, various resources in the PLD (e.g., programmable logic 420, programmable interconnect 423, etc.) may be programmed or configured.

Figure 14:
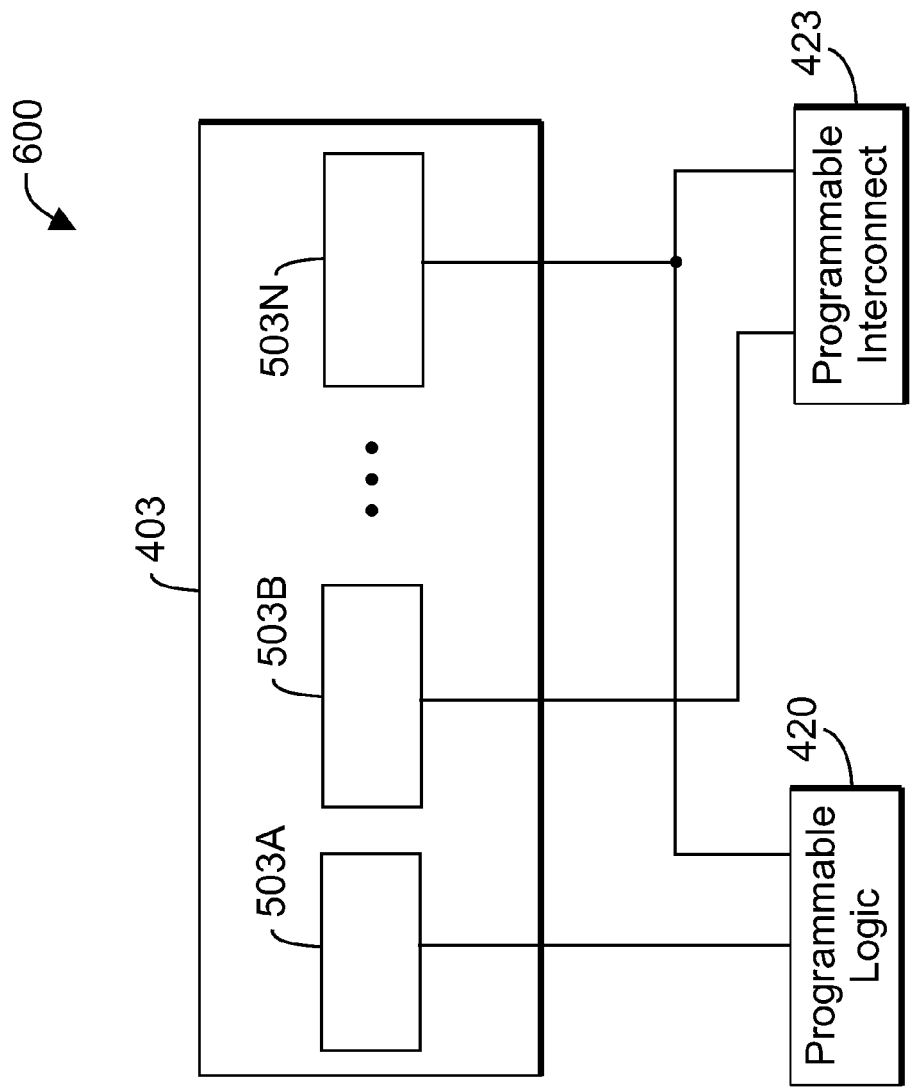
FIG. 14 illustrates a circuit arrangement for programming circuitry within a PLD according to an exemplary embodiment.

FIG. 14 illustrates a circuit arrangement 600 for programming circuitry within PLD 500 according to an exemplary embodiment. More particularly, circuit arrangement 600 shows circuitry for programming or configuring programmable logic 420 and/or programmable interconnect 423, using CRAM 403.

Circuit arrangement 600 includes CRAM 403, programmable logic 420, and programmable interconnect 423. CRAM 403 includes memory cells (or latches or storage devices or circuits) 503A-503N. Each of memory cells 503A-503N may include a thyristor-based latch, for example, as shown in FIGS. 1, 2, 8, and 9. Thus, each of memory cells 503A-503N may include one thyristor, two thyristors, or more than two thyristors, as desired.

The memory cells in CRAM 403 may program or configure any of the programmable circuitry in PLD 500. For example, some memory cells may program or configure programmable logic 420. As another example, some memory cells may program or configure programmable interconnect 423. As yet another example, some memory cells may program both programmable logic 420 and programmable interconnect 423. Furthermore, some memory cells may program other programmable blocks or resources within PLD 500, as desired. Examples include I/O circuitry 426, communication circuitry 438, processor(s) 435, etc.

In the exemplary embodiment shown in FIG. 14, memory cell 503A configures or programs programmable logic 420. Memory cell 503B, on the other hand, programs or configures programmable interconnect 423. Memory cell 503N configures or programs both programmable logic 420 and programmable interconnect 423.

Figure 15:
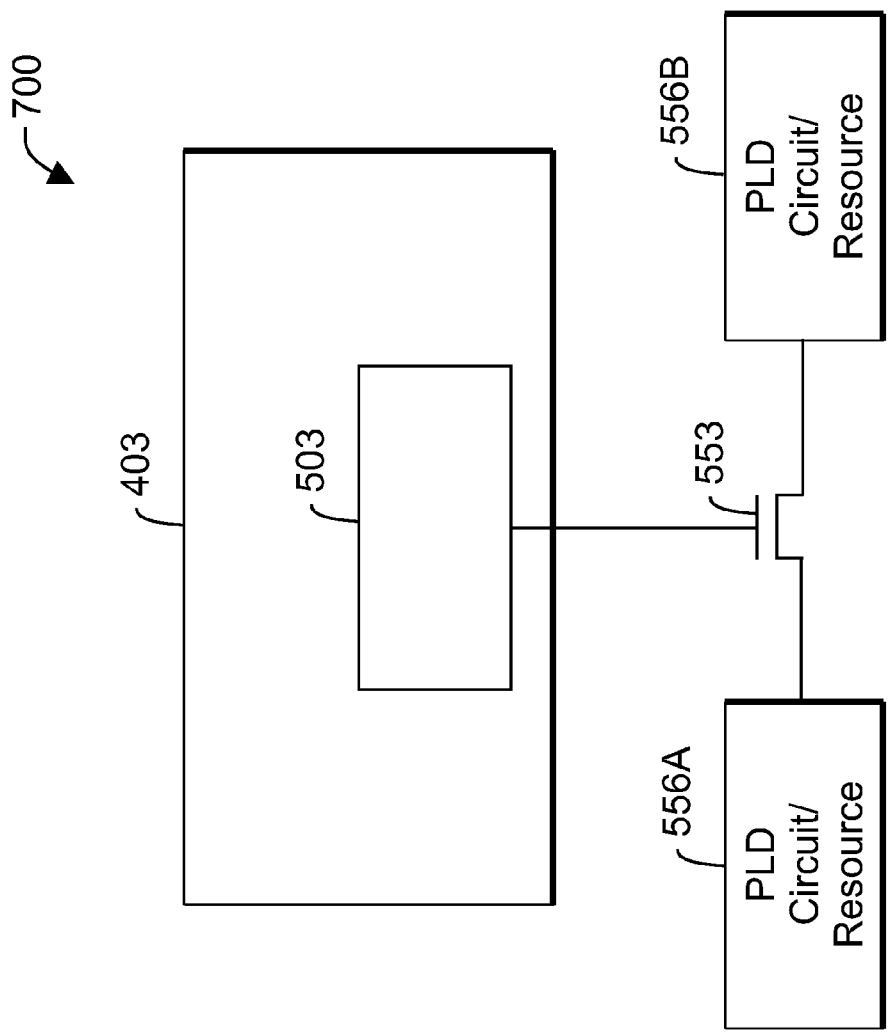
FIG. 15 shows a circuit arrangement for programming the resources or circuitry within a PLD according to another exemplary embodiment.

FIG. 15 shows a circuit arrangement 700 for programming the resources or circuitry within a PLD according to another exemplary embodiment. More particularly, circuit arrangement 700 depicts a mechanism for improving the performance of programmable interconnect 423 in PLD 500 (see FIG. 11).

Circuit arrangement 700 includes CRAM 403, PLD circuit/resource 556A, transistor 553, and PLD circuit/resource 556B. CRAM 403 includes memory cell (or latch or storage device or circuit) 503. Each of PLD circuit/resource 556A and PLD circuit/resource 556B may constitute or include any of several blocks or circuits in PLD 500 (see FIG. 11). Examples include programmable logic 420, programmable interconnect 423, I/O circuitry 426, test/debug circuitry 429, processor(s) 435, communication circuitry 435, memory 441, and controller(s) 444.

Memory cell 503 may include a thyristor-based latch, for example, as shown in FIGS. 1, 2, 8, and 9. Thus, memory cell 503 may include one thyristor, two thyristors, or more than two thyristors, as desired.

Transistor 553 constitutes part of programmable interconnect 423. In the embodiment shown, transistor 553 provides a programmable or configurable coupling mechanism between PLD circuit/resource 556A and PLD circuit/resource 556B.

Put another way, transistor 553 acts as a pass transistor that, under the control of memory cell 503, couples PLD circuit/resource 556A to PLD circuit/resource 556B. If memory cell 503 stores a binary "1" value, transistor 553 turns on, and couples PLD circuit/resource 556A to PLD circuit/resource 556B. Conversely, if memory cell 503 stores a binary "0" value, transistor 553 turns off, and decouples PLD circuit/resource 556A from PLD circuit/resource 556B. Thus, under the control of memory cell 503, transistor 553 selectively couples PLD circuit/resource 556A to PLD circuit/resource 556B, i.e., it acts as a programmable interconnect.

To provide good coupling (i.e., with relatively low parasitic resistance, capacitance, etc.), one wants to turn on transistor 553 hard. Doing so ordinarily entails using a relatively high gate voltage. Unlike conventional CRAM cells, where one has the concern of gate oxide breakdown in the presence of relatively high voltages, memory cell 503 can provide a higher gate voltage than the nominal supply voltage ($V_{DD, nom}$) of PLD 500.

Specifically, one may supply memory cell 503 with a higher supply voltage, say, $V_{DD, high}$. In other words, referring to FIGS. 1, 2, 8, and 9, the supply voltage (labeled as "$V_{DD}$" in the figures) coupled to the thyristor circuits has a voltage $V_{DD, high}$. The voltage $V_{DD, high}$ has a higher value than the nominal supply voltage, $V_{DD, nom}$. Put another way, transistor 553 operates in response to a higher gate voltage than would be the case with a memory cell powered from $V_{DD, nom}$. Consequently, transistor 553 provides an improved coupling mechanism between PLD circuit/resource 556A and PLD circuit/resource 556B.

Figure 16:
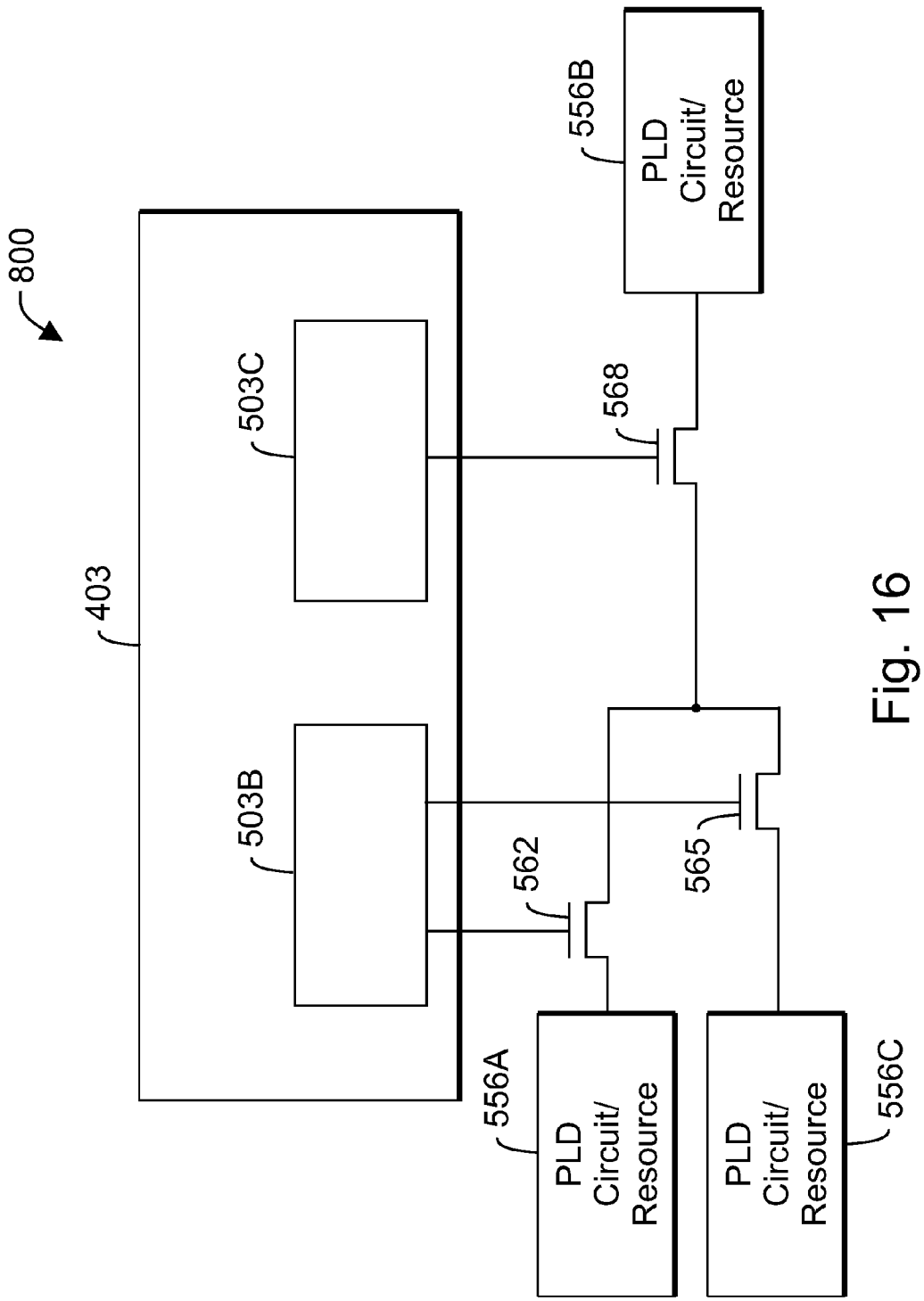
FIG. 16 depicts a circuit arrangement for programming the resources or circuitry within a PLD according to yet another exemplary embodiment.

FIG. 16 shows a circuit arrangement 800 for programming the resources or circuitry within PLD 500 according to another exemplary embodiment. More specifically, circuit arrangement 800 depicts another mechanism for improving the performance of programmable interconnect 423 in PLD 500 (see FIG. 11).

Circuit arrangement 800 includes CRAM 403, PLD circuits/resources 556A-556C, and transistors 562, 565, and 568. CRAM 403 includes memory cells (or latches or storage devices or circuits) 503B and 503C. Each of PLD circuits/resources 556A-556C may constitute or include any of several blocks or circuits in PLD 500 (see FIG. 11). Examples include programmable logic 420, programmable interconnect 423, I/O circuitry 426, test/debug circuitry 429, processor(s) 435, communication circuitry 435, memory 441, and controller(s) 444.

Each of memory cells 503B-503C may include a thyristor-based latch, for example, as shown in FIGS. 1, 2, 8, and 9. Thus, each of memory cells 503B-503C may include one thyristor, two thyristors, or more than two thyristors, as desired.

Transistors 562, 565, and 568 constitutes parts of programmable interconnect 423. In the embodiment shown, transistors 562 and 568 provide a programmable or configurable coupling mechanism between PLD circuit/resource 556A and PLD circuit/resource 556B. Similarly, transistors 565 and 568 provide a programmable or configurable coupling mechanism between PLD circuit/resource 556B and PLD circuit/resource 556C.

Put another way, transistors 562 and 568 act as pass transistors that, under the control of memory cells 503B and 503C, respectively, couple PLD circuit/resource 556A to PLD circuit/resource 556B. If memory cell 503B and memory cell 503C each stores a binary "1" value, transistors 562 and 568, respectively, turn on, and couples PLD circuit/resource 556A to PLD circuit/resource 556B. Conversely, if either or both of memory cells 503B-503C stores a binary "0" value, transistor 562, transistor 568, or both, turns off, and decouples PLD circuit/resource 556A from PLD circuit/resource 556B. Thus, under the control of memory cells 503B-503C, transistors 562 and 568 selectively couple PLD circuit/resource 556A to PLD circuit/resource 556B, i.e., the transistors acts as a programmable interconnect.

Similarly, transistors 565 and 568 act as pass transistors that, under the control of memory cells 503B and 503C, respectively, couple PLD circuit/resource 556B to PLD circuit/resource 556C. If memory cell 503B and memory cell 503C each stores a binary "1" value, transistors 565 and 568, respectively, turn on, and couples PLD circuit/resource 556B to PLD circuit/resource 556C. Conversely, if either or both of memory cells 503B-503C stores a binary "0" value, transistor 565, transistor 568, or both, turns off, and decouples PLD circuit/resource 556B from PLD circuit/resource 556C. Thus, under the control of memory cells 503B-503C, transistors 565 and 568 selectively couple PLD circuit/resource 556B to PLD circuit/resource 556C, i.e., the transistors acts as a programmable interconnect.

As noted above, to provide good coupling between PLD circuits/resources, one should turn transistors 562, 565, and 568 on hard. Doing so ordinarily entails using a relatively high gate voltages. Memory cells 503B-503C can provide a higher gate voltage than the nominal supply voltage ($V_{DD, nom}$) of PLD 500.

Specifically, one may supply memory cells 503B-503C with a higher supply voltage (or more than one such voltage, as desired), say, $V_{DD, high}$. In other words, referring to FIGS. 1, 2, 8, and 9, the supply voltage (labeled as "$V_{DD}$" in the figures) coupled to the thyristor circuits has a voltage $V_{DD, high}$. The voltage $V_{DD, high}$ has a higher value than the nominal supply voltage, $V_{DD, nom}$. Put another way, transistors 562, 565, and 568 operate in response to higher gate voltages than would be the case with memory cells powered from $V_{DD, nom}$. Consequently, transistors 562, 565, and 568 provide an improved coupling mechanism between PLD circuit/resource 556A and PLD circuit/resource 556B, and between PLD circuit/resource 556B and PLD circuit/resource 556C, respectively.

Note that although the exemplary embodiments in FIG. 15 and FIG. 16 show, respectively, one and two levels of pass transistors, one may apply the disclosed concepts to other circuit arrangements, as desired. Specifically, in FIG. 15, a memory cell according to the disclosed concepts drives one level of pass transistors (e.g., transistor 553), whereas in FIG. 16, memory cells according to the disclosed concepts drive two levels of pass transistors (transistors 562 and 565, and transistor 568, respectively).

As persons of ordinary skill in the art who have the benefit of the description of the disclosed concepts understand, however, one may use an appropriate number of memory cells according to the disclosed concepts to drive desired levels of pass transistors. As one example, one might use memory cells according to the disclosed concepts to drive three levels of pass transistors (arranged similar to a multiplexer (MUX) structure) in programmable or configurable interconnect. Thus, the first level would include one transistor, the second level two transistors, and the third level four transistors. Of course, as persons of ordinary skill in the art who have the benefit of the description of the disclosed concepts understand, one may extend this concept to more complex pass transistor structures, as desired.

The embodiments described above refer to PLDs although, as persons of ordinary skill in the art who have the benefit of the description of the disclosed concepts understand, one may apply the disclosed concepts to a variety of other ICs (in addition to general purpose ICs, ASICs, etc., as described above). Examples include custom, standard-cell, gate-array, field-programmable gate arrays (FPGAs), and the like.

Note that the embodiments described above use positive logic (i.e., a higher voltage to denote binary "1" and a lower voltage to denote binary "0"). One may, however, apply the disclosed concepts to other logic configurations (e.g., negative logic), as desired, by making modifications that fall within the knowledge of persons of ordinary skill in the art who have the benefit of the description of the disclosed concepts.

Furthermore, without loss of generality, the exemplary embodiments described in this document may use a particular type or polarity of transistor. For example, some embodiments may use N-type MOS (NMOS) transistors. One may, however, apply the disclosed concepts to other types of circuitry, as desired. For example, one may, however, use other types or polarities of transistors and circuits (e.g., P-type MOS (PMOS) or CMOS circuitry) by making modifications that fall within the knowledge of persons of ordinary skill in the art who have the benefit of the description of the disclosed concepts.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the disclosure in this document understand. Other modifications and alternative embodiments of the disclosed concepts in addition to those described here will be apparent to persons of ordinary skill in the art who have the benefit of the description of the disclosure. Accordingly, this description teaches those skilled in the art the manner of carrying out the disclosed concepts and are to be construed as illustrative only.

The forms of the disclosed concepts and embodiments shown and described should be taken as the presently preferred or illustrative embodiments. Persons skilled in the art may make various changes in the shape, size and arrangement of parts without departing from the scope of the disclosure in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosure.

The invention claimed is:

1. An integrated circuit (IC), comprising:
a memory circuit, comprising a plurality of coupled thyristors, wherein a first thyristor in the plurality of thyristors comprises a bipolar transistor, and a metal oxide semiconductor (MOS) transistor coupled between a collector and an emitter of the bipolar transistor, the MOS transistor having a gate adapted to be selectively coupled to a column line in response to a signal on a row line.

2. The integrated circuit (IC) according to claim 1, wherein the memory circuit comprises two thyristors.

3. The integrated circuit (IC) according to claim 2, wherein the memory circuit includes more than two thyristors.

4. The integrated circuit (IC) according to claim 2, wherein the memory circuit has improved susceptibility to single even upsets (SEUs).

5. The integrated circuit (IC) according to claim 2, wherein a thyristor in the plurality of thyristors comprises an NPN bipolar junction transistor (BJT) coupled to a PNP bipolar junction transistor (BJT).

6. The integrated circuit (IC) according to claim 5, wherein the NPN bipolar junction transistor (BJT) is back-to-back coupled to the PNP bipolar junction transistor (BJT).

7. The integrated circuit (IC) according to claim 5, wherein at least one thyristor in the plurality of thyristors comprises a metal oxide semiconductor (MOS) transistor coupled to the NPN bipolar junction transistor (BJT) and the PNP bipolar junction transistor (BJT).

8. The integrated circuit (IC) according to claim 1, further comprising an interface circuit coupled to the memory circuit.

9. The integrated circuit (IC) according to claim 8, wherein the interface circuit comprises a first transistor coupled to a row line and a column line.

10. The integrated circuit (IC) according to claim 1, wherein the plurality of thyristors are coupled in tandem.

11. The integrated circuit (IC) according to claim 9, wherein the interface circuit further comprises a second transistor coupled to a read line and to a first thyristor in the plurality of thyristors in the memory circuit.

12. The integrated circuit (IC) according to claim 11, wherein the interface circuit further comprises a third transistor coupled to the row line and to the first thyristor in the plurality of thyristors in the memory circuit.

13. The integrated circuit (IC) according to claim 1, wherein the memory circuit is fabricated using a complementary metal oxide semiconductor (CMOS) fabrication process.

14. A circuit arrangement, comprising:
a memory cell, comprising a first thyristor comprising a first bipolar transistor, and a metal oxide semiconductor (MOS) transistor coupled between a collector and an emitter of the first bipolar transistor, the MOS transistor having a gate adapted to be selectively coupled to a column line in response to a signal on a row line; and
an interface circuit coupled to the memory cell, wherein the interface circuit comprises a first transistor coupled to a row line and a column line.

15. The circuit arrangement according to claim 14, wherein the interface circuit further comprises a second transistor coupled to the memory cell, the column line, and a read line.

16. The circuit arrangement according to claim 15, wherein the interface circuit further comprises a third transistor coupled to the memory cell and the row line.

17. The circuit arrangement according to claim 14, wherein the metal oxide semiconductor (MOS) transistor is coupled to the first transistor.

18. The circuit arrangement according to claim 14, wherein the first thyristor comprises a second bipolar junction transistor (BJT) coupled to the first bipolar junction transistor (BJT).

19. The circuit arrangement according to claim 14, wherein the memory cell further comprises a second thyristor coupled to the first thyristor.

20. The circuit arrangement according to claim 19, wherein the second thyristor is coupled to the first transistor.

21. The circuit arrangement according to claim 14, wherein the memory cell and the interface circuit are fabricated using a complementary metal oxide semiconductor (CMOS) fabrication process.

22. An integrated circuit (IC), comprising:
a memory, comprising:
a first memory cell, wherein the first memory cell comprises at least one thyristor, comprising a bipolar transistor, and a metal oxide semiconductor (MOS) transistor coupled between a collector and an emitter of the bipolar transistor, the MOS transistor having a gate adapted to be selectively coupled to a column line in response to a signal on a row line.

23. The integrated circuit (IC) according to claim 22, wherein the first memory cell includes at least two thyristors.

24. The integrated circuit (IC) according to claim 23, wherein at least one of the at least two thyristors includes an NPN bipolar junction transistor (BJT) coupled to a PNP bipolar junction transistor (BJT).

25. The integrated circuit (IC) according to claim 24, wherein in the at least one thyristor the NPN bipolar junction transistor (BJT) is back-to-back coupled to the PNP bipolar junction transistor (BJT).

26. The integrated circuit (IC) according to claim 23, wherein the first memory cell comprises two thyristors.

27. The integrated circuit (IC) according to claim 23, wherein the first memory cell has improved susceptibility to single upset events (SEUs).

28. The integrated circuit (IC) according to claim 22, further comprising logic circuitry, wherein the first memory cell is coupled to the logic circuitry.

29. The integrated circuit (IC) according to claim 22, further comprising interconnect circuitry, wherein the first memory cell is coupled to the interconnect circuitry.

30. The integrated circuit (IC) according to claim 29, wherein the first memory cell has a supply voltage higher than a supply voltage of the integrated circuit (IC).

31. The integrated circuit (IC) according to claim 30, wherein the interconnect circuitry comprises at least one transistor having a gate terminal, wherein the first memory cell provides a voltage to the gate terminal of the at least one transistor, wherein the voltage is higher than the supply voltage of the integrated circuit (IC).

32. The integrated circuit (IC) according to claim 22, further comprising an interface circuit coupled to the first memory cell.

33. The integrated circuit (IC) according to claim 22, wherein the memory further comprises a second memory cell, wherein the first memory cell couples to interconnect circuitry, and wherein the second memory cell couples to logic circuitry.

34. The integrated circuit (IC) according to claim 33, wherein the first memory cell has a supply voltage higher than a supply voltage of the integrated circuit (IC).

* * * * *